United States Patent
Shu et al.

(10) Patent No.: US 10,475,693 B1
(45) Date of Patent: Nov. 12, 2019

(54) METHOD FOR FORMING SINGLE DIFFUSION BREAKS BETWEEN FINFET DEVICES AND THE RESULTING DEVICES

(71) Applicant: GLOBALFOUNDRIES Inc., Grand Cayman (KY)

(72) Inventors: Jiehui Shu, Clifton Park, NY (US); Hong Yu, Rexford, NY (US); Jinping Liu, Ballston Lake, NY (US); Hui Zang, Guilderland, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 16/002,403

(22) Filed: Jun. 7, 2018

(51) Int. Cl.
| | |
|---|---|
| H01L 21/76 | (2006.01) |
| H01L 21/762 | (2006.01) |
| H01L 29/66 | (2006.01) |
| H01L 21/8234 | (2006.01) |
| H01L 27/088 | (2006.01) |

(52) U.S. Cl.
CPC ........ *H01L 21/76224* (2013.01); *H01L 21/823431* (2013.01); *H01L 27/0886* (2013.01); *H01L 29/66795* (2013.01)

(58) Field of Classification Search
CPC ....... H01L 21/76224; H01L 21/823431; H01L 21/823437; H01L 21/823481; H01L 21/845; H01L 27/0886; H01L 27/1211; H01L 29/165; H01L 29/66545; H01L 29/66795; H01L 29/7848
See application file for complete search history.

(56) References Cited

U.S. PATENT DOCUMENTS

| | | | |
|---|---|---|---|
| 7,485,508 B2 * | 2/2009 | Dyer | H01L 21/84 257/E21.415 |
| 8,609,510 B1 | 12/2013 | Banna et al. | |
| 8,674,413 B1 | 3/2014 | Chi | |
| 8,703,577 B1 | 4/2014 | Zhu | |
| 9,123,773 B1 * | 9/2015 | Shen | H01L 21/76232 |
| 9,171,752 B1 | 10/2015 | Wu et al. | |
| 9,263,516 B1 * | 2/2016 | Wu | H01L 21/76224 |
| 9,362,181 B1 * | 6/2016 | Xie | H01L 21/823878 |
| 9,368,496 B1 * | 6/2016 | Yu | H01L 27/0886 |
| 9,406,676 B2 | 8/2016 | Yu et al. | |
| 9,412,616 B1 | 8/2016 | Xie et al. | |
| 9,570,442 B1 * | 2/2017 | Liu | H01L 27/0886 |
| 9,824,931 B2 * | 11/2017 | Tseng | H01L 21/0228 |
| 9,831,272 B2 * | 11/2017 | Chen | H01L 27/11807 |

(Continued)

*Primary Examiner* — Mohammed Shamsuzzaman
(74) *Attorney, Agent, or Firm* — Amerson Law Firm, PLLC

(57) ABSTRACT

A method includes forming a first hard mask layer above a substrate. The first hard mask layer is patterned to define a plurality of fin openings and at least a first diffusion break opening. A first etch process is performed to define a plurality of fins in the substrate and a first diffusion break recess in a selected fin. A first dielectric layer is formed between the fins and in the first diffusion break recess to define a first diffusion break. A second hard mask layer having a second opening positioned above the first diffusion break is formed above the first hard mask layer and the first dielectric layer. A second dielectric layer is formed in the second opening. The second hard mask layer is removed. A second etch process is performed to recess the first dielectric layer to expose upper portions of the plurality of fins.

20 Claims, 9 Drawing Sheets

View 1      View 2

(56) References Cited

U.S. PATENT DOCUMENTS

| | | | |
|---|---|---|---|
| 10,062,768 B2* | 8/2018 | Choi | H01L 29/66545 |
| 10,083,964 B1* | 9/2018 | Reznicek | H01L 29/0649 |
| 10,236,216 B2* | 3/2019 | Zhao | H01L 21/823431 |
| 10,332,980 B2* | 6/2019 | Shen | H01L 29/0653 |
| 2011/0053310 A1* | 3/2011 | Yonezawa | H01L 31/022425 |
| | | | 438/87 |
| 2014/0327087 A1 | 11/2014 | Kim et al. | |
| 2015/0054089 A1 | 2/2015 | Hong et al. | |
| 2015/0294969 A1 | 10/2015 | Lee et al. | |
| 2016/0190130 A1* | 6/2016 | Yu | H01L 21/823481 |
| | | | 257/401 |
| 2016/0225762 A1* | 8/2016 | Zang | H01L 27/0886 |
| 2018/0040694 A1* | 2/2018 | Tseng | H01L 21/76224 |
| 2019/0221469 A1* | 7/2019 | Hsu | H01L 21/76224 |

* cited by examiner

METHOD FOR FORMING SINGLE DIFFUSION BREAKS BETWEEN FINFET DEVICES AND THE RESULTING DEVICES

BACKGROUND OF THE INVENTION

1. Field of the Invention

The present disclosure generally relates to the fabrication of semiconductor devices, and, more particularly, to a method for forming a single diffusion break between finFET devices and the resulting devices.

2. Description of the Related Art

In modern integrated circuits, such as microprocessors, storage devices and the like, a very large number of circuit elements, especially transistors, are provided and operated on a restricted chip area. In integrated circuits fabricated using metal-oxide-semiconductor (MOS) technology, field effect transistors (FETs) (both NMOS and PMOS transistors) are provided that are typically operated in a switching mode. That is, these transistor devices exhibit a highly conductive state (on-state) and a high impedance state (off-state). FETs may take a variety of forms and configurations. For example, among other configurations, FETs may be either so-called planar FET devices or three-dimensional (3D) devices, such as finFET devices.

In contrast to a FET, which has a planar structure, a so-called finFET device has a three-dimensional (3D) structure. FIG. 1 is a side view of an illustrative prior art finFET semiconductor device 100 that is formed above a semiconductor substrate 105. In this example, the finFET device 100 includes three illustrative fins 110, a gate structure 115, sidewall spacers 120 and a gate cap 125. The gate structure 115 is typically comprised of a layer of insulating material (not separately shown), e.g., a layer of high-k insulating material or silicon dioxide, and one or more conductive material layers (e.g., metal and/or polysilicon) that serve as the gate electrode for the device 100. The fins 110 have a three-dimensional configuration. The portions of the fins 110 covered by the gate structure 115 is the channel region of the finFET device 100. An isolation structure 130 is formed between the fins 110. In a conventional process flow, the portions of the fins 110 that are positioned outside of the spacers 120, i.e., in the source/drain regions of the device 100, may be increased in size or even merged together by performing one or more epitaxial growth processes. The process of increasing the size of the fins 110 in the source/drain regions of the device 100 is performed to reduce the resistance of source/drain regions and/or make it easier to establish electrical contact to the source/drain regions.

A particular fin 110 may be used to fabricate multiple devices. One or more diffusion breaks are formed along the axial length of the fin 110 to define separate fin portions by removing a portion of the fin 110 and replacing it with a dielectric material. The process for forming a diffusion break may gouge the fin. The fin may be recessed to form cavities for subsequently formed epitaxial source/drain regions. Because of the fin gouging, the cavities adjacent the diffusion break are deeper and the epitaxial regions have a reduced height compared to those formed on other regions of the fin 110. This epitaxial material underfill changes the electrical characteristics of the device 100 in the region adjacent to the diffusion break.

The present disclosure is directed to various methods and resulting devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming semiconductor devices. One illustrative method includes, among other things, forming a first hard mask layer above a substrate. The first hard mask layer is patterned to define a plurality of fin openings and at least a first diffusion break opening. A first etch process is performed through the first hard mask layer to define a plurality of fins in the semiconductor substrate and a first diffusion break recess in a selected fin of the plurality of fins. A first dielectric layer is formed between the plurality of fins and in the first diffusion break recess to define a first diffusion break in the selected fin. A second hard mask layer is formed above the first hard mask layer and the first dielectric layer. The second hard mask layer has a second opening positioned above the first diffusion break. A second dielectric layer is formed in the second opening. The second hard mask layer is removed. A second etch process is performed in the presence of the first hard mask layer to recess the first dielectric layer to expose upper portions of the plurality of fins.

Another illustrative method includes, among other things, forming a first hard mask layer above a substrate. The first hard mask layer is patterned to define a plurality of fin openings and at least a first diffusion break opening. A first etch process is performed through the first hard mask layer to define a plurality of fins in the semiconductor substrate and a first diffusion break recess in a selected fin of the plurality of fins. A first dielectric layer is formed between the plurality of fins and in the first diffusion break recess to define a first diffusion break in the selected fin. A second diffusion break is formed in the selected fin through a second opening in the first hard mask layer. The second diffusion break is deeper than the first diffusion break. A second hard mask layer is formed above the first hard mask layer and the first dielectric layer. The second hard mask layer covers the second diffusion break and has a third opening positioned above the first diffusion break. A second dielectric layer is formed in the third opening. The second hard mask layer is removed. A second etch process is performed in the presence of the first hard mask layer after removing the second hard mask layer to recess the first dielectric layer to expose upper portions of the plurality of fins. The second etch process removes the second dielectric layer, a portion of the first diffusion break, a portion of the second diffusion break, and a first portion of the first hard mask layer. A second portion of the first hard mask layer remains above the plurality of fins after the first etch process.

BRIEF DESCRIPTION OF THE DRAWINGS

The disclosure may be understood by reference to the following description taken in conjunction with the accompanying drawings, in which like reference numerals identify like elements, and in which.

Figure 1:
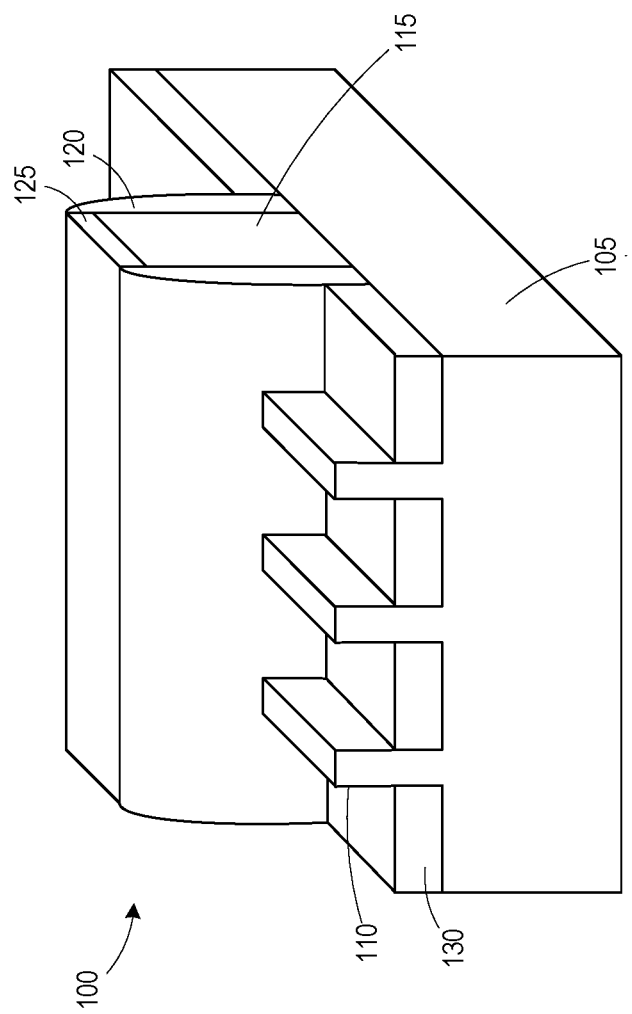
FIG. 1 schematically depicts an illustrative prior art finFET device.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally relates to various methods of forming finFET devices with a single diffusion break without causing significant underfill of epitaxial semiconductor regions formed in the fin and the resulting semiconductor devices. As will be readily apparent to those skilled in the art upon a complete reading of the present application, the present method is applicable to a variety of devices, including, but not limited to, logic devices, memory devices, etc. With reference to the attached figures, various illustrative embodiments of the methods and devices disclosed herein will now be described in more detail.

FIGS. 2A-2H illustrate various methods for forming a single diffusion break in a finFET device 200. FIGS. 2A-2H show a cross-sectional view (View 1) of the device 200 along the axial length of an illustrative fin 210 defined in a substrate 205, and a cross-sectional view (View 2) perpendicular to the axial length. A hard mask stack 215 including a first dielectric layer 220 (e.g., silicon dioxide) and a second hard mask layer 225 (e.g., silicon nitride) was formed above the substrate 205 and patterned to define fin openings 225A for forming a plurality of fins 210 (see FIG. 2B). The hard mask stack 215 was also patterned to define single diffusion break (SDB) openings 225B along the axial length of the fins to be formed.

The substrate 205 may a variety of forms, such as the bulk substrate illustrated. The substrate 205 may also have a silicon-on-insulator (SOI) configuration that includes a bulk silicon layer, a buried insulation layer and an active layer, wherein semiconductor devices are formed in and above the active layer. The substrate 205 may be formed of silicon or silicon germanium or it may be made of materials other than silicon, such as germanium. Thus, the terms "substrate" or "semiconductor substrate" should be understood to cover all semicon-ducting materials and all forms of such materials. The substrate 205 may have different layers. For example, the fin 210 may be formed in a process layer formed above the base layer of the substrate 205.

Figure 2A:
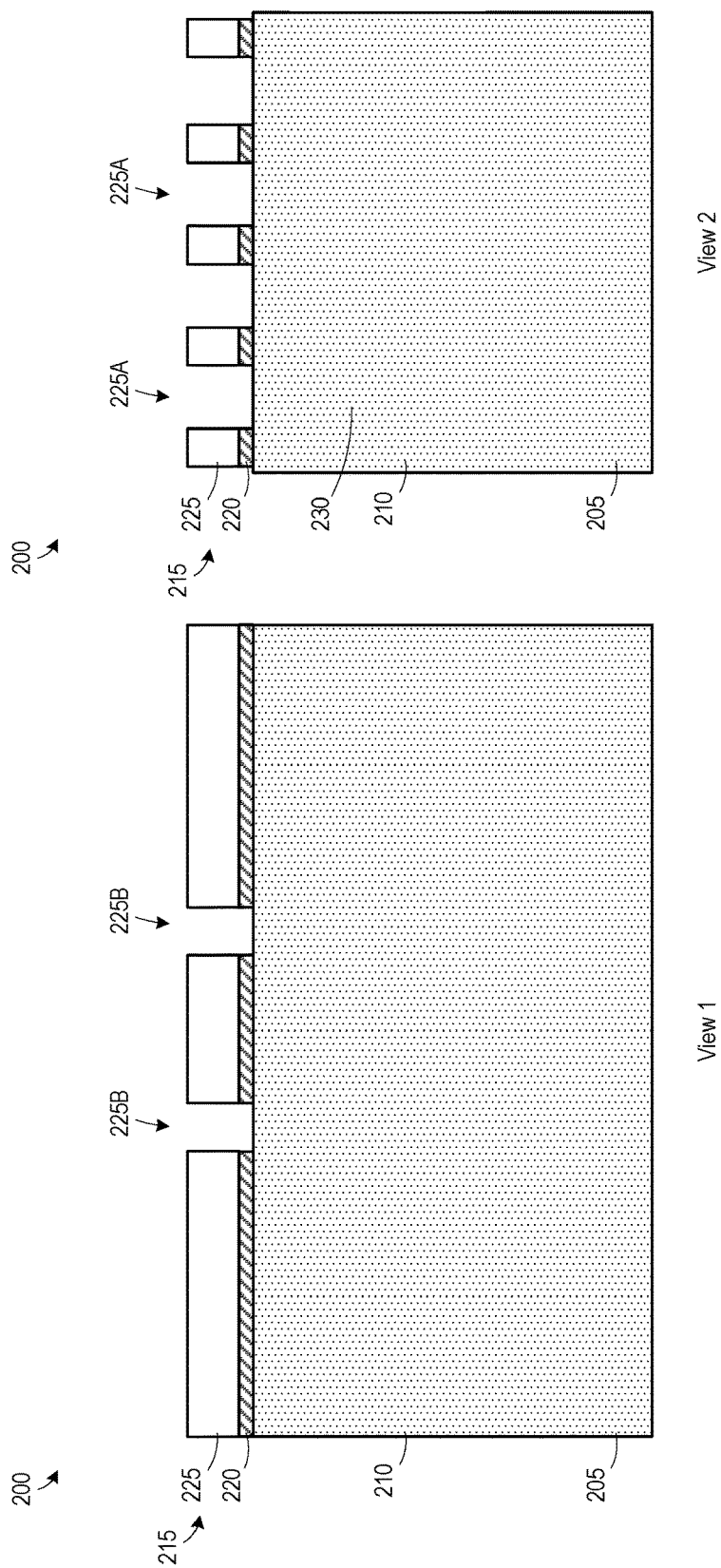
FIGS. 2A-2H depict various methods disclosed herein of forming single diffusion breaks in a finFET device.
Figure 2B:
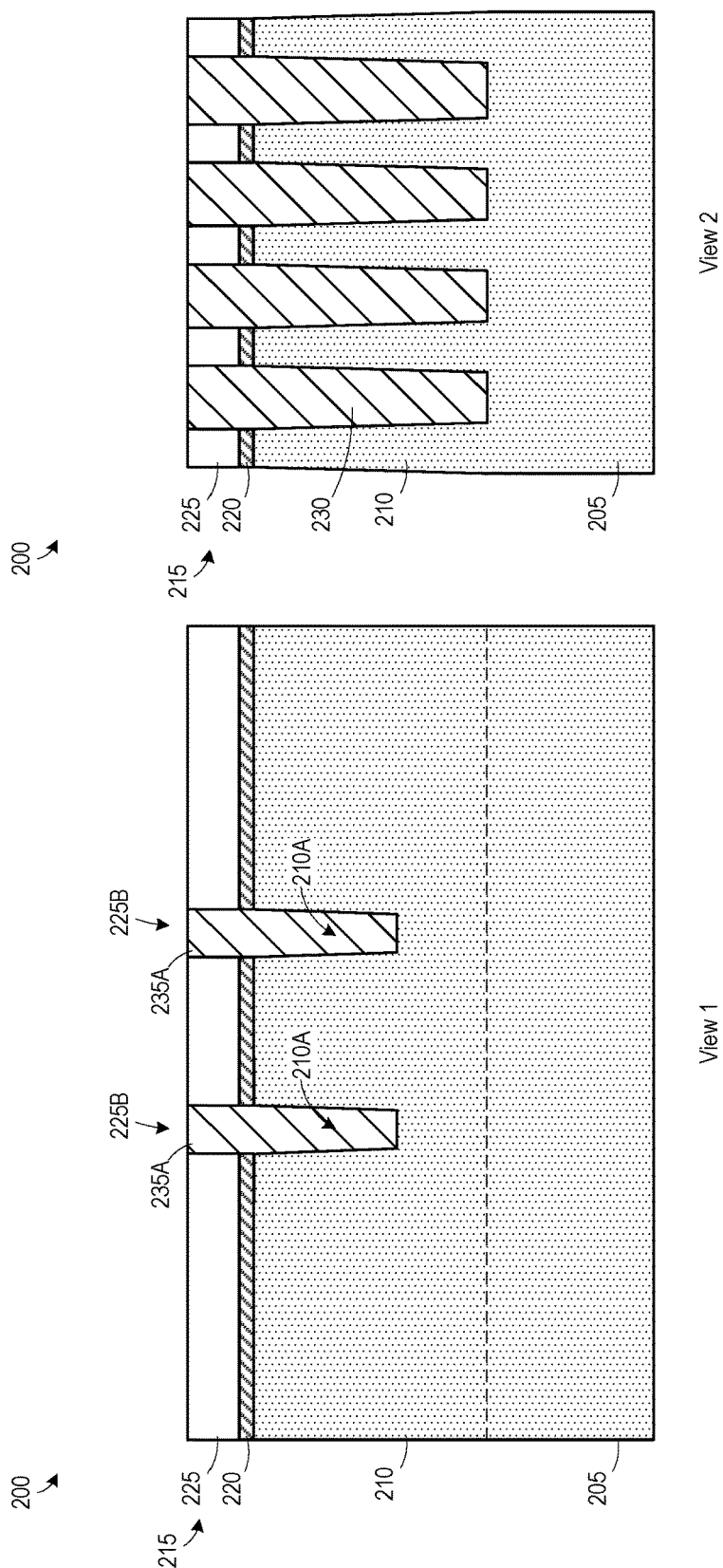

FIG. 2B illustrates the product 200 after an etch process was performed using the patterned hard mask stack 215 to define trenches in the substrate 205, thereby defining a plurality of fins 210 and single diffusion break recesses 210A that segment the associated fins 210. After the trench etch process, a deposition process was performed to deposit a dielectric material 230 (e.g., silicon dioxide) between the fins, and a planarization process was performed using the hard mask layer 225 as a stop layer, thereby defining single diffusion breaks 235A.

Figure 2C:
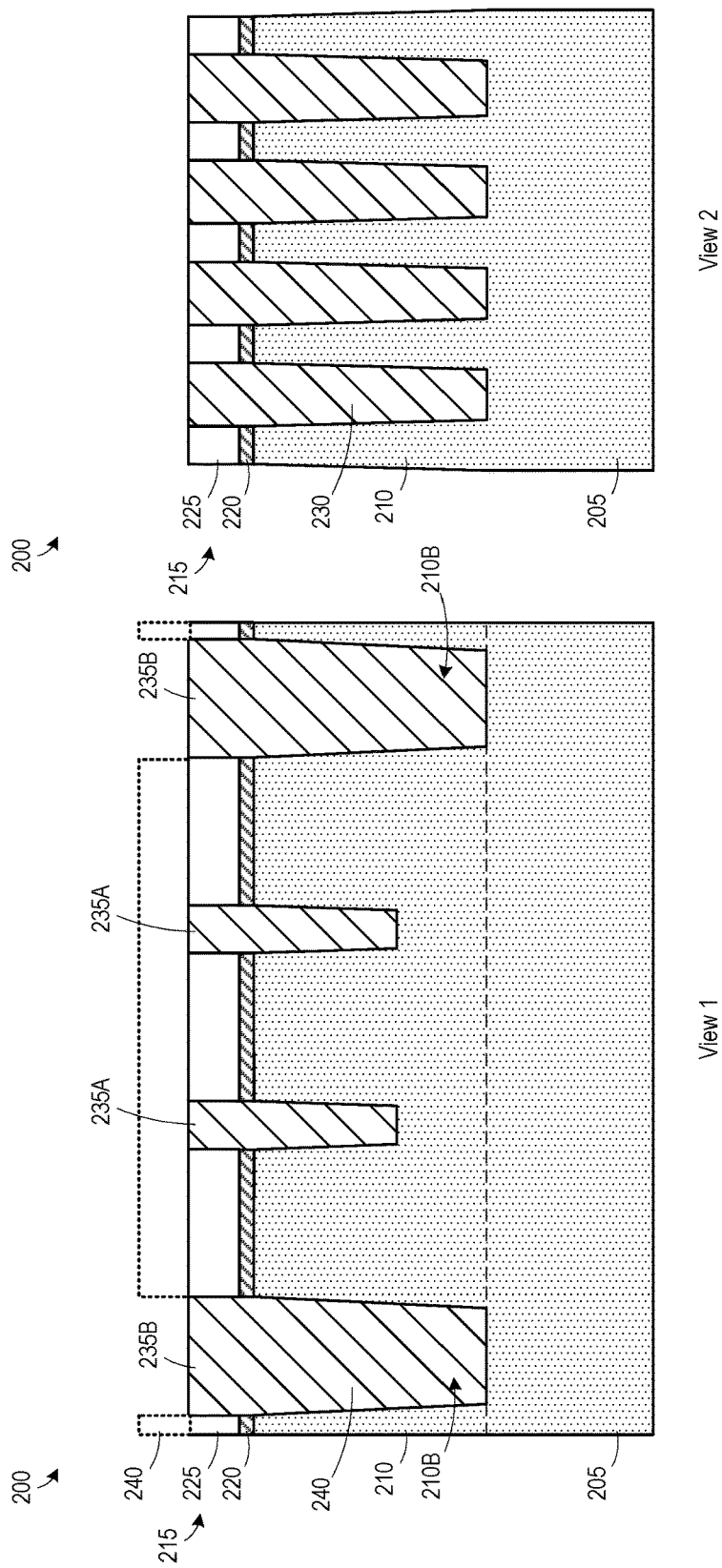

FIG. 2C illustrates the device 200 after several processes were performed. An additional hard mask layer 240 (shown in phantom) was formed and patterned above the hard mask layer 225. An etch process was performed through the patterned hard mask to define deep diffusion break openings 210B in the hard mask stack 215 and the fins 210. A deposition process was performed to deposit a dielectric layer 240 (e.g., silicon dioxide) in the deep diffusion break openings 210B and a planarization process was performed using the hard mask layer 225 as an etch stop, thereby defining deep diffusion breaks 235B in the fin 210.

Figure 2D:
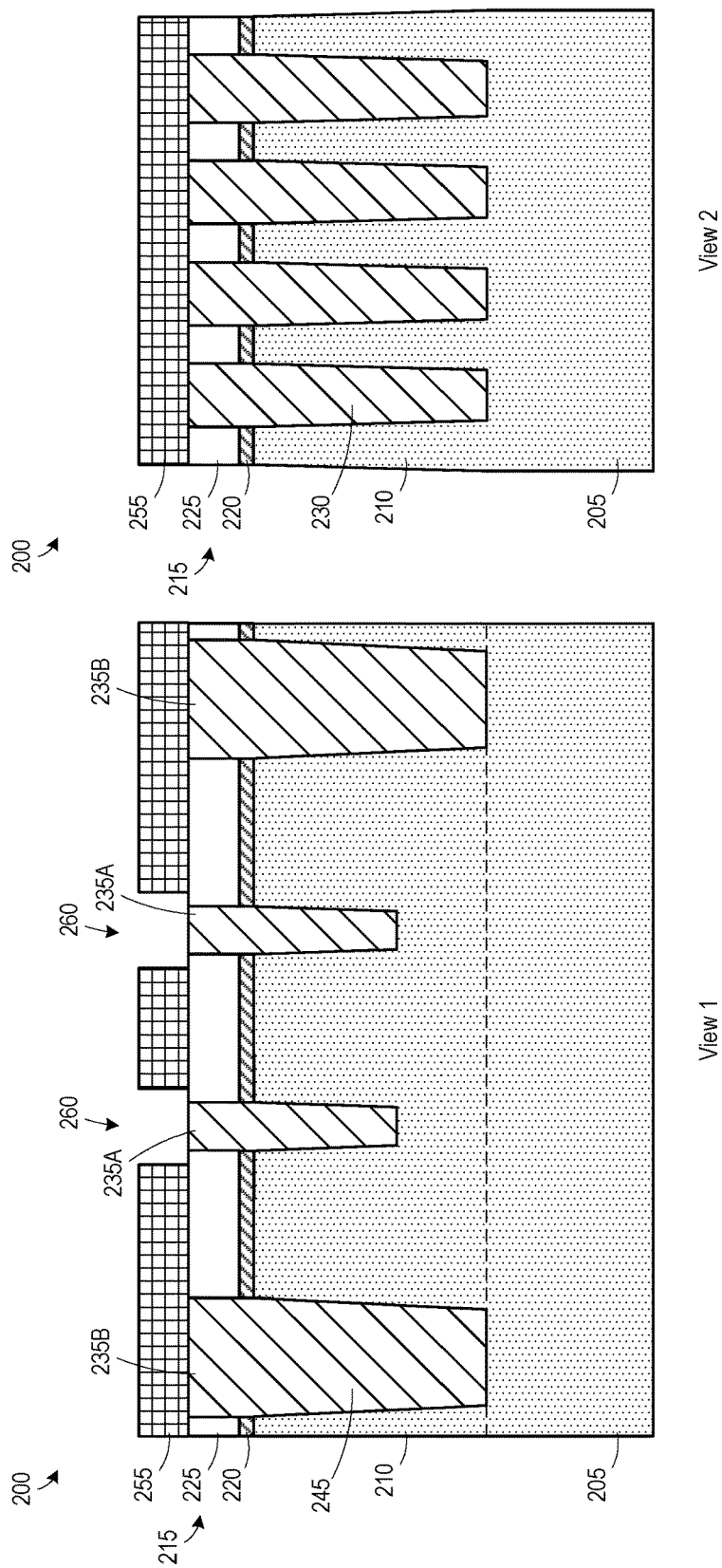

FIG. 2D illustrates the product 200 after a hard mask layer 255 (e.g., amorphous silicon, $TiO_2$, $Al_2O_3$) was deposited over the hard mask layer 225 and the dielectric layers 230, 245 and patterned to define openings 260 above the single diffusion breaks 235A.

Figure 2E:
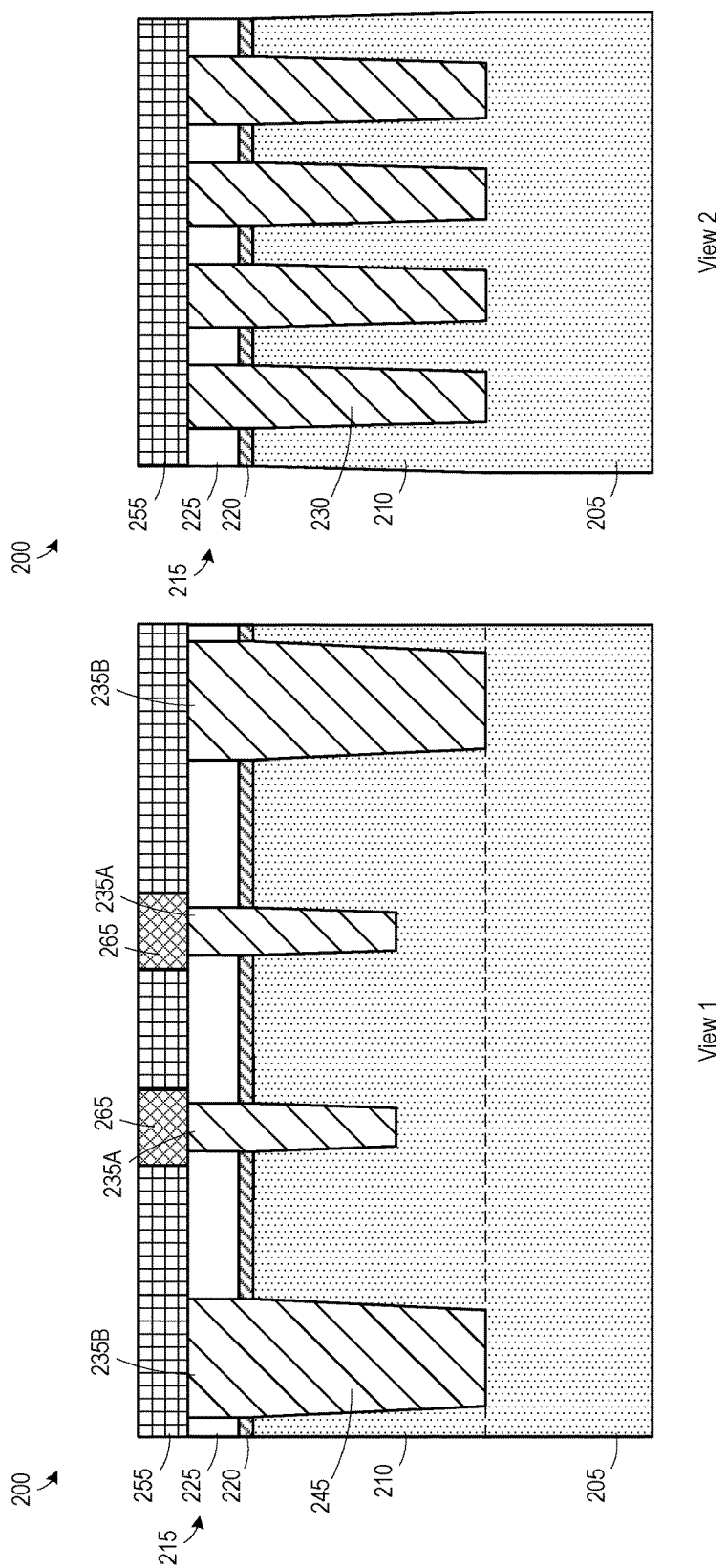

FIG. 2E illustrates the product 200 after a deposition was performed to form a high-density plasma (HDP) oxide layer 265 in the openings 260 and a planarization process was performed.

Figure 2F:
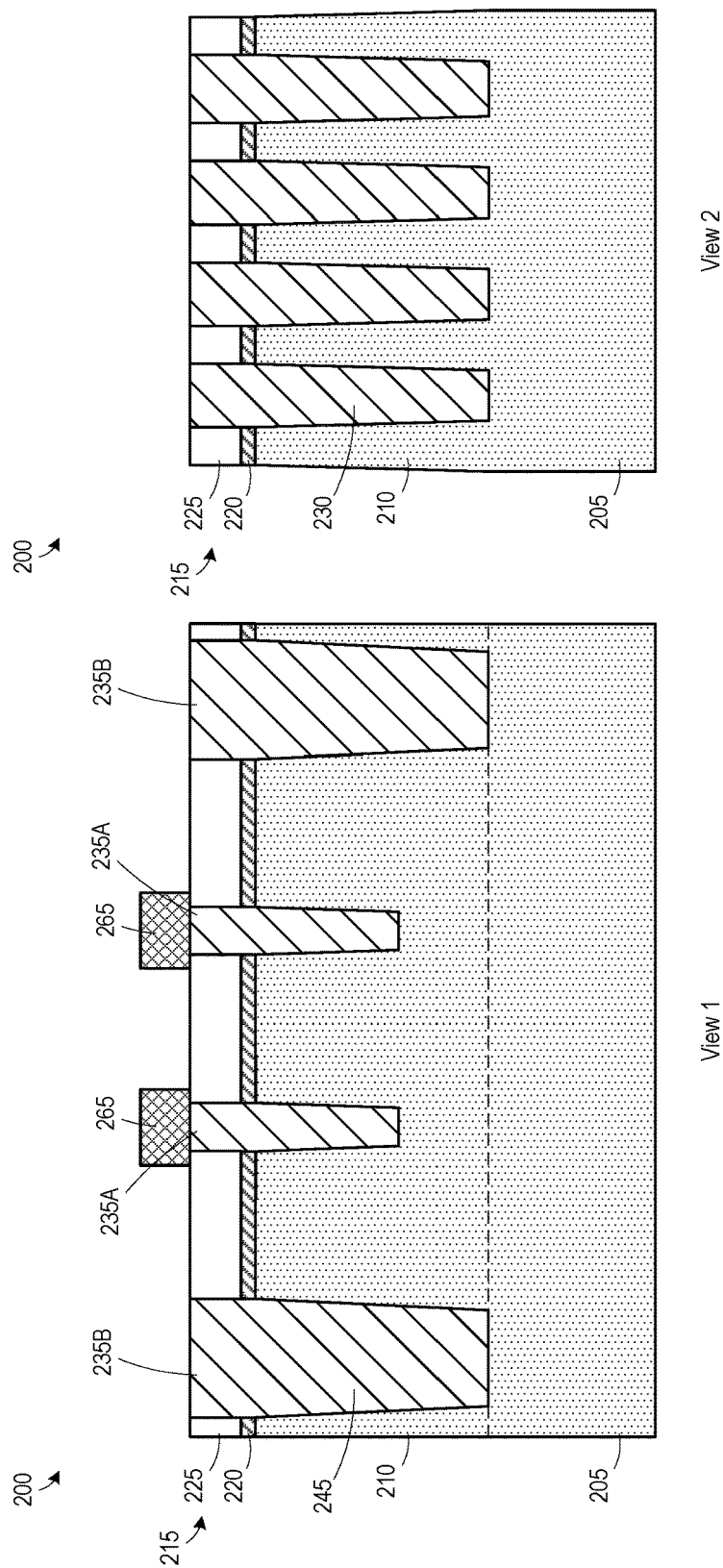

FIG. 2F illustrates the product 200 after an etch process (e.g., wet etch) was performed to selectively remove the hard mask layer 255.

Figure 2G:
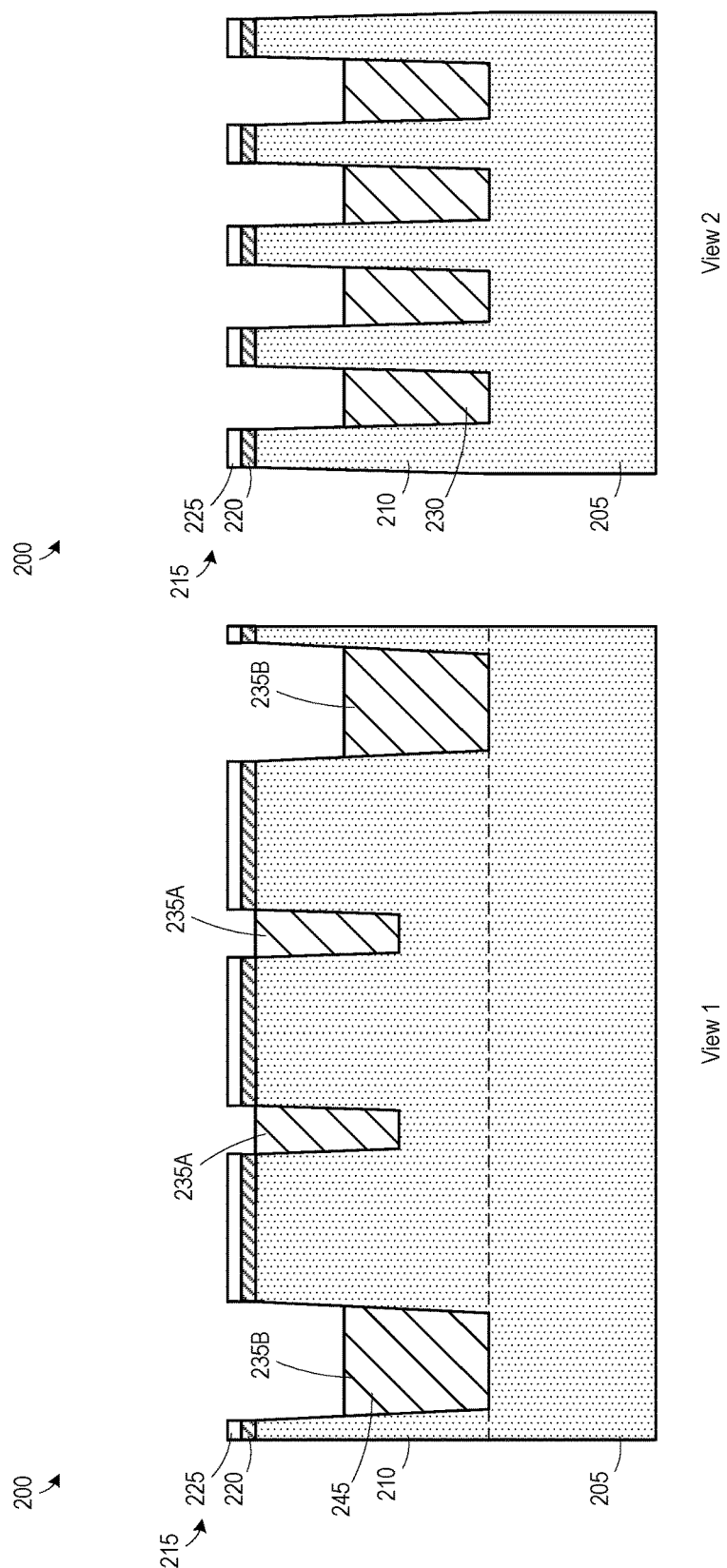

FIG. 2G illustrates the product 200 after an etch process (e.g., reactive ion etch process) was performed to reveal the fins 210 by recessing the dielectric layer 230. Due to imperfect etch selectivity, the fin reveal etch reduces the height of the hard mask layer 225 and also removes the HDP layer 265 and recesses the diffusion breaks 235A, 235B. The HDP oxide layer 265 acts as a buffer to allow control of the final height of the single diffusion breaks 235A. During this fin reveal etch, the hard mask layer 225 protects the surface of the fins 210, thereby preventing the gouging illustrated in FIG. 1B. Any gouging occurs in the hard mask layer 225 rather than the fins 210. The deep diffusion breaks 235B are recessed to a level below the height of the fins 210, and the single diffusion breaks 235A are recessed to a level approximately equal to the height of the fin 210 (i.e., the upper surfaces are coplanar).

Figure 2H:
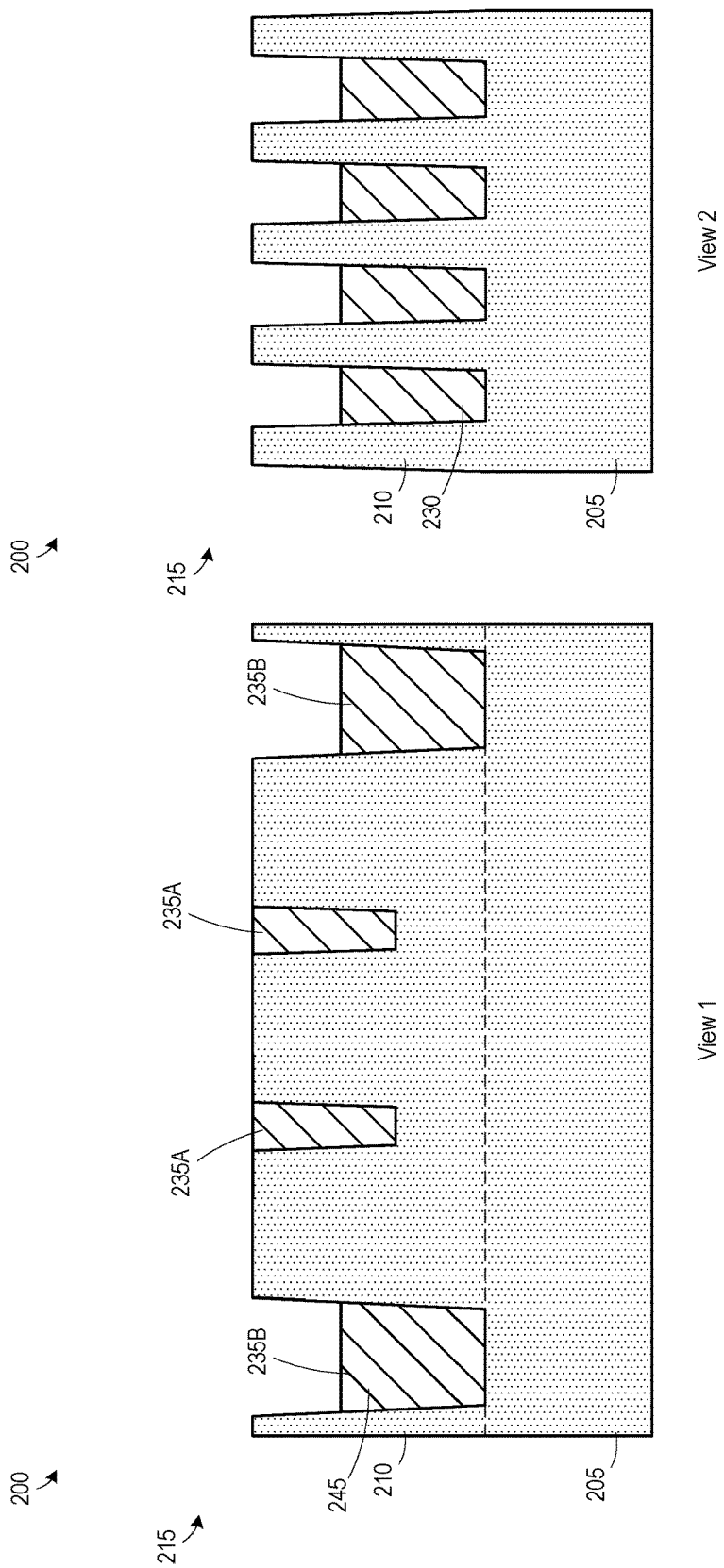

FIG. 2H illustrates the product 200 after one or more etch processes (e.g., wet etch processes) were performed to remove remaining portions of the hard mask layer 225 and the hard mask layer 220.

Processing may continue as illustrated in FIGS. 1C through 1E to fabricate the product 200. Because the gouging of the fins 210 adjacent the single diffusion breaks 235A is avoided, the post-fill heights of the epitaxial regions are consistent. The presence of the hard mask layer 225 during the fin reveal etch also provides additional protection for the top portion of the fins 210, thereby improving the top CD to bottom CD ratio.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modi-feed and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method, comprising:
    forming a first hard mask layer above a semiconductor substrate, said first hard mask layer being patterned to define a plurality of fin openings and at least a first diffusion break opening;
    performing a first etch process through said first hard mask layer to define a plurality of fins in said semiconductor substrate and a first diffusion break recess in a selected fin of said plurality of fins;
    forming a first dielectric layer between said plurality of fins and in said first diffusion break recess to define a first diffusion break in said selected fin;
    forming a second hard mask layer above said first hard mask layer and said first dielectric layer, said second hard mask layer having a second opening positioned above said first diffusion break;
    forming a second dielectric layer in said second opening;
    removing said second hard mask layer; and
    performing a second etch process in the presence of said first hard mask layer to recess said first dielectric layer to expose upper portions of said plurality of fins.

2. The method of claim 1, wherein said second etch process removes said second dielectric layer, a portion of said first diffusion break, and a first portion of said first hard mask layer, wherein a second portion of said first hard mask layer remains above said plurality of fins after said second etch process.

3. The method of claim 2, wherein said first diffusion break has an upper surface that is coplanar with an upper surface of said selected fin.

4. The method of claim 2, further comprising forming a second diffusion break in said selected fin through a second diffusion break opening in said first hard mask layer, wherein said second diffusion break is deeper than said first diffusion break, said second hard mask layer covers said second diffusion break while said second dielectric layer is formed, and said second etch process removes a portion of said second diffusion break.

5. The method of claim 4, wherein said first diffusion break has an upper surface that is coplanar with an upper surface of said selected fin, and said second diffusion break has an upper surface that is recessed with respect to said upper surface of said selected fin.

6. The method of claim 2, further comprising performing a third etch process after said second etch process to remove said second portion of said first hard mask layer.

7. The method of claim 6, wherein said second etch process comprises a reactive ion etch process, and said third etch process comprises a wet etch process.

8. The method of claim 1, wherein said second dielectric layer is formed using a high density plasma deposition process.

9. The method of claim 1, wherein said second opening is wider than said first diffusion break.

10. The method of claim 1, further comprising:
    forming said first dielectric layer in said first diffusion break opening and above said first hard mask layer; and
    planarizing said first dielectric layer using said first hard mask layer as a stop layer.

11. The method of claim 1, wherein said first and second hard mask layers comprise different materials.

12. A method, comprising:
    forming a first hard mask layer above a semiconductor substrate, said first hard mask layer being patterned to define a plurality of fin openings and at least a first diffusion break opening;
    performing a first etch process through said first hard mask layer to define a plurality of fins in said semiconductor substrate and a first diffusion break recess in a selected fin of said plurality of fins;
    forming a first dielectric layer between said plurality of fins and in said first diffusion break recess to define a first diffusion break in said selected fin;
    forming a second diffusion break in said selected fin through a second opening in said first hard mask layer, wherein said second diffusion break is deeper than said first diffusion break;
    forming a second hard mask layer above said first hard mask layer and said first dielectric layer, said second hard mask layer covering said second diffusion break and having a third opening positioned above said first diffusion break;
    forming a second dielectric layer in said third opening;
    removing said second hard mask layer; and
    performing a second etch process in the presence of said first hard mask layer after removing said second hard mask layer to recess said first dielectric layer to expose upper portions of said plurality of fins, wherein said second etch process removes said second dielectric layer, a portion of said first diffusion break, a portion of said second diffusion break, and a first portion of said first hard mask layer, wherein a second portion of said first hard mask layer remains above said plurality of fins after said first etch process.

13. The method of claim 12, wherein said first diffusion break has an upper surface that is coplanar with an upper surface of said selected fin, and said second diffusion break has an upper surface that is recessed with respect to said upper surface of said selected fin.

14. The method of claim 12, further comprising performing a third etch process after said second etch process to remove said second portion of said first hard mask layer.

15. The method of claim 12, wherein forming said second diffusion break in said selected fin comprises:
    forming said second opening in said first hard mask layer to a first region of said selected fin;
    removing portions of said selected fin in said first region to define a deep diffusion break cavity; and
    forming a third dielectric layer in said deep diffusion break cavity.

16. The method of claim 15, wherein said third dielectric layer fills said second opening.

17. The method of claim 12, wherein said second dielectric layer is formed using a high density plasma deposition process.

18. The method of claim 14, wherein said second etch process comprises a reactive ion etch process, and said third etch process comprises a wet etch process.

19. The method of claim 12, wherein said third opening is wider than said first diffusion break.

20. The method of claim 12, wherein said first and second hard mask layers comprise different materials.

* * * * *